United States Patent
Miyazawa

(10) Patent No.: US 8,587,002 B2
(45) Date of Patent: Nov. 19, 2013

(54) ORGANIC EL PANEL AND METHOD OF MANUFACTURING THE SAME

(75) Inventor: Kazutoshi Miyazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/637,658

(22) PCT Filed: Jan. 12, 2012

(86) PCT No.: PCT/JP2012/000160
§ 371 (c)(1),
(2), (4) Date: Sep. 27, 2012

(87) PCT Pub. No.: WO2012/117656
PCT Pub. Date: Sep. 7, 2012

(65) Prior Publication Data
US 2013/0015475 A1   Jan. 17, 2013

(30) Foreign Application Priority Data
Mar. 2, 2011   (JP) .................. 2011-045014

(51) Int. Cl.
*H01L 51/52* (2006.01)
*H01L 51/56* (2006.01)

(52) U.S. Cl.
USPC .................... 257/88; 257/40; 438/34

(58) Field of Classification Search
CPC .............................. H01L 51/52; H01L 51/56
USPC ................. 438/34; 257/88, 40, E51.018
See application file for complete search history.

(56) References Cited

U.S. PATENT DOCUMENTS

| | | |
|---|---|---|
| 5,883,437 A | 3/1999 | Maruyama et al. |
| 2001/0017517 A1 | 8/2001 | Yamazaki |
| 2002/0047095 A1 | 4/2002 | Morishige et al. |
| 2002/0047567 A1 | 4/2002 | Fujita et al. |
| 2002/0142697 A1 | 10/2002 | Yamagata et al. |
| 2004/0119399 A1 | 6/2004 | Nagayama |
| 2005/0178752 A1 | 8/2005 | Morishige et al. |
| 2005/0196892 A1 | 9/2005 | Yamagata et al. |
| 2009/0021156 A1 | 1/2009 | Kinoshita et al. |
| 2009/0159817 A1 | 6/2009 | Irie et al. |
| 2010/0233931 A1 | 9/2010 | Yamagata et al. |

FOREIGN PATENT DOCUMENTS

| | | |
|---|---|---|
| JP | 8-203898 | 8/1996 |
| JP | 2002-83691 | 3/2002 |
| JP | 2002-131888 | 5/2002 |
| JP | 2002-260857 | 9/2002 |

(Continued)

OTHER PUBLICATIONS

International Search Report of PCT Application No. PCT/JP2012/000160 dated Feb. 7, 2012.

(Continued)

*Primary Examiner* — Walter H Swanson
(74) *Attorney, Agent, or Firm* — Panasonic Patent Center

(57) ABSTRACT

A local luminance reduction at defects in pixel electrodes with a rapid and easy method is achieved by providing a method of manufacturing an organic EL panel that includes a TFT panel and organic EL devices disposed over a surface of the TFT panel in matrix arrangement, each of the organic EL devices including: a pixel electrode disposed over the surface of the TFT panel, an organic luminescent layer disposed over the pixel electrode; and a counter electrode disposed over the organic functional layer.

7 Claims, 7 Drawing Sheets

(56) References Cited

FOREIGN PATENT DOCUMENTS

| | | |
|---|---|---|
| JP | 2002-343567 | 11/2002 |
| JP | 2004-103488 | 4/2004 |
| JP | 2004-253214 | 9/2004 |
| JP | 2004-281328 | 10/2004 |
| JP | 2007-123616 | 5/2007 |
| JP | 2008-159930 | 7/2008 |
| JP | 2009-027036 | 2/2009 |
| JP | 2009-158126 | 7/2009 |
| JP | 2009-251119 | 10/2009 |
| WO | WO 2010122782 | * 10/2010 |

OTHER PUBLICATIONS

The Extended European Search Report dated Jun. 21, 2013 for the related European Patent Application No. 12751820.7.

* cited by examiner

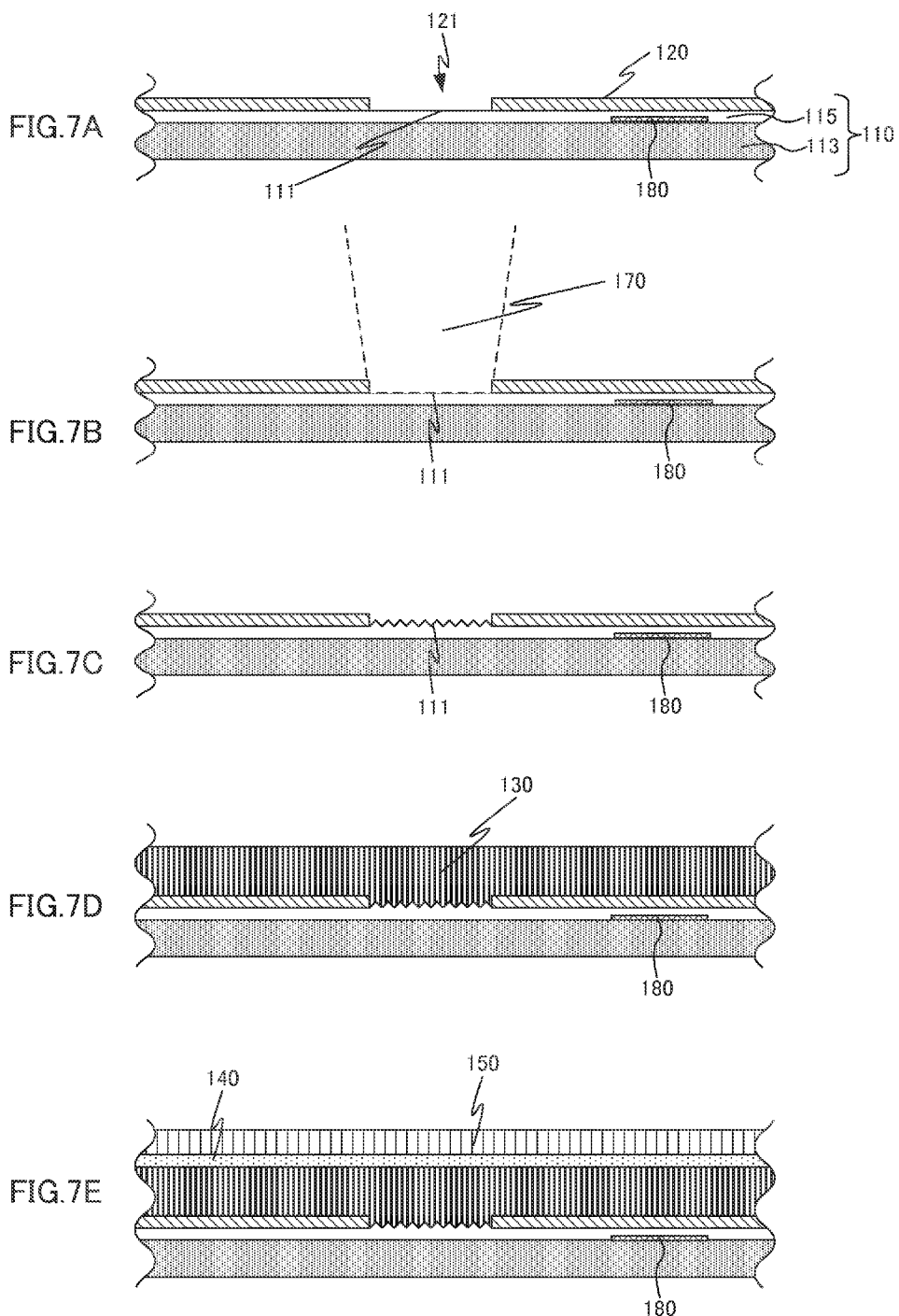

ORGANIC EL PANEL AND METHOD OF MANUFACTURING THE SAME

TECHNICAL FIELD

The present invention relates to organic EL panels and methods of manufacturing the same.

BACKGROUND ART

An active matrix organic EL panel includes a TFT panel incorporated with thin-film transistors (TFTs) for controlling each individual sub-pixel, and organic EL devices disposed over the TFT panel.

Each organic EL device used in organic EL displays generally includes a pixel electrode formed over the surface of the TFT panel; an organic functional layer disposed over the pixel electrode, which organic functional layer contains fluorescent molecules; and a counter electrode disposed over the organic functional layer.

Recent increases in size and definition of organic EL panels has resulted in high probability of generation of defects in which portions of interconnects (e.g., pixel electrodes) on the TFT panel's surface are lost. For improved production yields, various approaches have been proposed that aim to repair such defects generated in the interconnects on the TFT panel (see, e.g., Patent Literatures 1 to 3).

For example, Patent Literature 1 discloses repairing defective interconnects by coating the defect with a conductive repair paste (repair liquid) and baking the same by irradiation with a laser beam. Patent Literature 2 discloses repairing defective interconnects by depositing metal in the defect by irradiation with a laser beam using laser CVD apparatus. Patent Literature 3 discloses repairing defective interconnects by firmly attaching a metal film-bearing transfer member to the defect and irradiating the same with a laser beam to transfer the metallic film into the defect.

Other known approaches include applying a laser beam onto a heat-sensitive layer on the out-coupling side of a defective pixel of an organic EL device to form a light diffusion zone in the heat-sensitive layer, to lessen luminance reduction at the defective pixel (see, e.g., Patent Literatures 4 and 5); detecting, after formation of an organic luminescent layer, a pattern defect in the organic luminescent layer using infrared rays before proceeding to the subsequent step (see, e.g., Patent Literatures 6 and 7); covering the defect in the pixel electrode with insulating material prior to counter electrode formation (see, e.g., Patent Literature 8); cutting, among the multiplicity of interconnection layers stacked on top of each other, only the interconnect in the defective interconnection layer by laser etching based on the stored data such that the defect is electrically separated (see. e.g., Patent Literature 9); configuring organic EL devices to include pixel electrodes disposed on the planarized surface of a TFT panel (see, e.g., Patent Literatures 10 and 11); and configuring organic EL devices to include insulating films between the electrode layers of TFTs for preventing short circuits between the electrodes (see, e.g., Patent Literatures 12 and 13).

CITATION LIST

Patent Literature

[PTL 1] Japanese Patent Application Laid-Open No. 08-203898
[PTL 2] Japanese Patent Application Laid-Open No. 2002-131888
[PTL 3] Japanese Patent Application Laid-Open No. 2009-251119
[PTL 4] Japanese Patent Application Laid-Open No. 2009-027036
[PTL 5] U.S. Patent Application Publication No. 2009/0021156
[PTL 6] Japanese Patent Application Laid-Open No. 2009-158126
[PTL 7] U.S. Patent Application Publication No. 2009/0159817
[PTL 8] Japanese Patent Application Laid-Open No. 2004-253214
[PTL 9] Japanese Patent Application Laid-Open No. 2007-123616
[PTL 10] Japanese Patent Application Laid-Open No. 2002-083691
[PTL 11] U.S. Patent Application Publication No. 2000/0047567
[PTL 12] Japanese Patent Application Laid-Open No. 2004-103488
[PTL 13] U.S. Patent Application Publication No. 2004/0119399

SUMMARY OF INVENTION

Technical Problem

All of the repairing methods disclosed by Patent Literatures 1 to 3 require expensive equipment such as laser CVD apparatus or transfer apparatus, contributing to increased production costs. These repairing methods are also time-consuming and therefore rapid repair of interconnects has been difficult.

Furthermore, the repairing methods disclosed by Patent Literatures 1 to 3 are directed to repair of relatively large defects. For example, difficulties have been encountered with these methods in repairing defects of 20 μm or less in diameter. More specifically, when attempting to repair relatively small defects by laser CVD as taught in Patent Literature 2, it becomes more likely that the device is contaminated with foreign substance, which is undesirable. Moreover, when attempting to repair relatively small defects by attachment of new interconnect material as taught in Patent Literature 1 or 3, there are cases where the interconnect material is misplaced or where the repaired interconnect becomes non-uniform in thickness.

It has thus been difficult with the conventional repairing methods to successfully repair defective pixel electrodes having a relatively small defect. The defect in the pixel electrode becomes a non-luminescent area (defect) in the resultant organic EL device. Accordingly, unless any proper measure is taken, even a small defect causes a local luminance reduction in the organic EL device, leading to poor organic EL panel quality.

The present invention has been accomplished in an aim to overcome the foregoing drawback pertinent in the art, and an object of the present invention is to provide a method of manufacturing an organic EL panel, which method enables to easily lessen local luminance reductions at defects in pixel electrodes in short time.

Solution to Problem

The inventor has established that luminance reduction caused by defects in pixel electrodes can be avoided by roughening the exposed surface of the TFT panel at the defects without having to repair the defects. The inventor then completed the present invention with additional studies.

A first aspect of the present invention thus relates to methods of manufacturing an organic EL panel given below.

A) A method of manufacturing an organic EL panel, including:
  providing a TFT panel;
  patterning pixel electrodes on a surface of the TFT panel;
  detecting in the pixel electrodes defects in which the surface of the TFT panel is exposed;
  roughening a portion of the surface of the TFT panel by applying a laser beam onto the portion, the portion including a surface exposed through a defect of the defects in a pixel electrode of the pixel electrodes;
  forming an organic functional layer over the pixel electrodes and the roughened portion of the surface of the TFT panel exposed through the defect in the pixel electrode; and
  forming a counter electrode over the organic functional layer.

B) The method according to A), wherein the laser beam has a wavelength of 400 nm or less.

C) The method according to A) or B), further including:
  determining a criteria from which one or more of the defects to be repaired is selected; and
  selecting, from the defects detected, one or more of the defects that comply with the criteria,
  wherein the laser beam is applied onto the surface of the TFT panel, the surface exposed through the one or more of the defects selected.

A second aspect of the present invention relates to organic EL panels given below.

D) An organic EL panel including:
  a TFT panel; and
  organic EL devices disposed over a surface of the TFT panel in matrix arrangement, each of the organic EL devices including a pixel electrode disposed over the surface of the TFT panel, an organic luminescent layer disposed over the pixel electrode, and a counter electrode disposed over the organic functional layer,
  wherein at least one of the organic EL devices has a defect in which the surface of the TFT panel is exposed,
  the surface exposed through the defect is roughened, and
  the organic luminescent layer is disposed over the roughened portion of the surface of the TFT panel.

E) The organic EL panel according to D), wherein the roughened surface of the TFT panel exposed through the defect has an arithmetic average roughness of 0.25 µm or more.

F) The organic EL panel according to D) or E), wherein the TFT panel includes a substrate, TFTs disposed over the substrate in matrix arrangement, and a planarization film disposed over the substrate so as to cover the TFTs, the planarization film constituting the surface of the TFT panel.

G) The organic EL panel according to F), wherein the planarization film is formed of a cured product of a photosensitive resin.

Advantageous Effects of Invention

The present invention enables to lessen luminance reductions at defects in pixel electrodes in short time without relying on expensive equipment. The present invention thus enables rapid and inexpensive manufacture of organic EL panels having minimized luminance unevenness.

BRIEF DESCRIPTION OF DRAWINGS

FIG. 7 illustrates a flow of manufacture of an organic EL panel according to an embodiment of the present invention.

DESCRIPTION OF EMBODIMENTS

1. Method of Manufacturing Organic EL Panel

The present invention is effective particularly for the manufacture of large-screen organic EL panels. The reason for this is that manufacture of large-screen organic EL displays suffers from high risk of generation of defects in the pixel electrodes and therefore it is highly necessary to lessen luminance reductions caused by such defects. A manufacturing method according to an embodiment of the present invention will now be described with reference to the flowchart depicted in FIG. 1.

Figure 1:
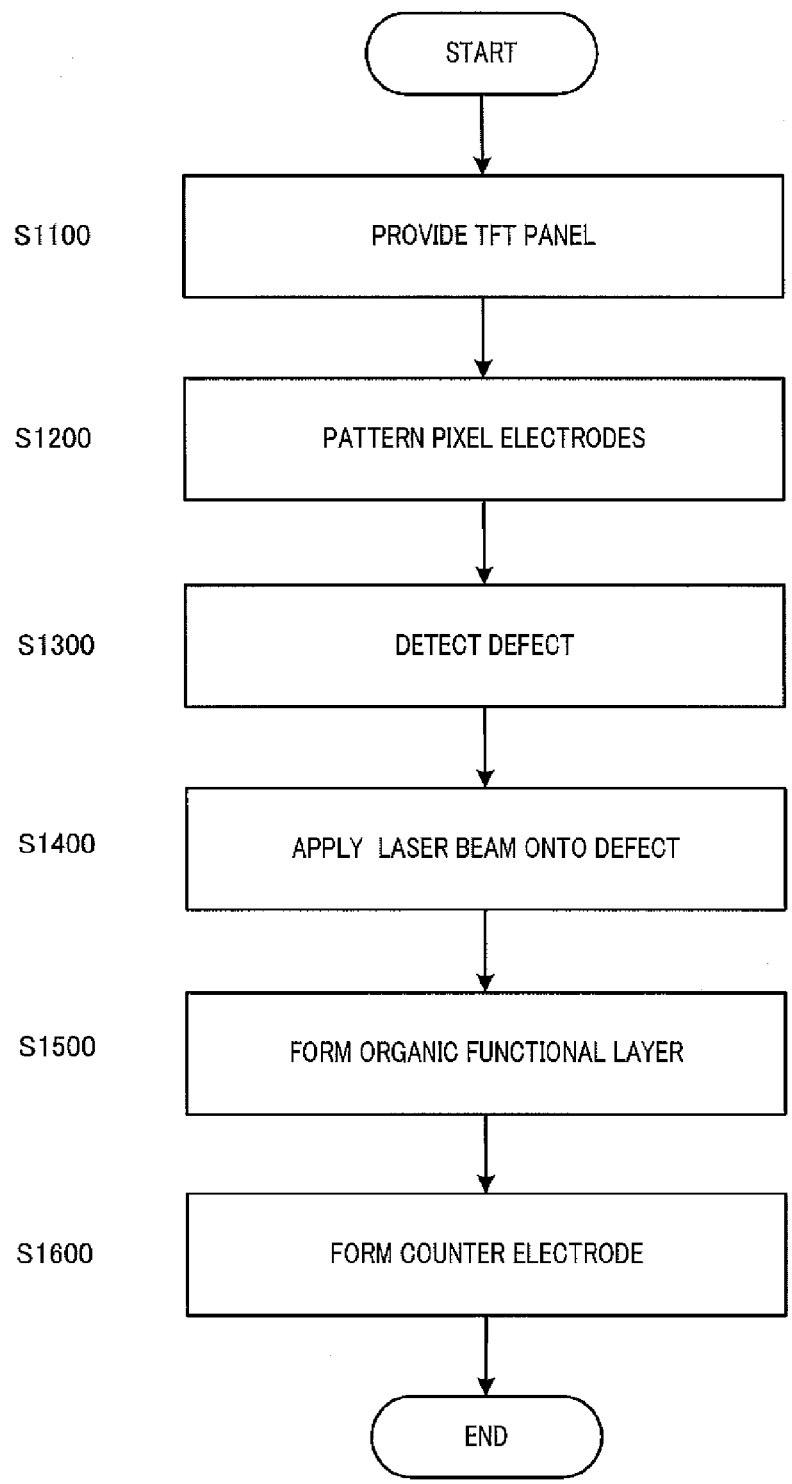
FIG. 1 is a flowchart of a method of manufacturing an organic EL panel according to an embodiment of the present invention.

As seen from the flowchart depicted in FIG. 1, the manufacturing method according to an embodiment of the present invention includes: 1) a first step of providing a TFT panel (S1100); 2) a second step of patterning pixel electrodes on a surface of the TFT panel (S1200); 3) a third step of detecting in the pixel electrodes any defect in which the surface of the TFT panel is exposed (S1300); 4) a fourth step of roughening a surface of the TFT panel by applying a laser beam thereon, the surface being exposed through the defect in the pixel electrode (S1400); 5) a fifth step of forming an organic functional layer over the pixel electrode and the surface of the TFT panel exposed through the defect in the pixel electrode (S1500); and 6) a sixth step of forming a counter electrode over the organic functional layer (S1600). Each step will now be described in detail.

1) In the first step, a TFT panel is provided. Pixel electrodes (later described), i.e., organic EL devices are disposed on a surface of the TFT panel. The TFT panel includes a substrate, thin-film transistors (hereinafter may simply referred to as "TFTs") disposed over the substrate in matrix arrangement; and a planarization film disposed over the substrate so as to cover the TFTs. The planarization film constitutes the surface of the TFT panel. The TFT panel may be provided by applying resin material, a material of the planarization film, over a surface of a substrate having TFTs disposed in matrix arrangement and by curing the resin material. Examples of the resin material to be applied include photosensitive resins. Thus the planarization film is formed of, for example, a cured product of photosensitive resin.

2) In the second step, pixel electrodes are patterned on the surface of the TFT panel in matrix arrangement or other arrangement. Patterning of pixel electrodes on the surface of the TFT panel in matrix arrangement may be accomplished by depositing a metal film made of pixel electrode material onto the entire surface of the TFT panel by sputtering, vapor deposition or other method, and etching the deposited metal film by photolithography.

There are cases where during etching of the metal film to pattern pixel electrodes an otherwise unetched area of the metal film is also etched, resulting in a portion of the patterned the pixel electrode being lost. Such a defect in the pixel electrode (hereinafter may simply referred to as "defect")

becomes a non-luminescent area in the resulting organic EL device. If such a defect in the pixel electrode is left without being repaired, the organic EL device exhibits reduced luminance.

The following description of the third and fourth steps is directed to a measure with which to lessen luminance reductions at such defects in the pixel electrodes.

3) In the third step, the pixel electrodes are checked for the presence of a defect, where the surface of the TFT panel is exposed. There are no particular limitations on the method of detection of defects; examples include microscopic visual inspection, image inspection, and pattern inspection. Image inspection and pattern inspection includes the die-to-die inspection mode in which the images of adjacent dies are compared for detecting defects, and the die-to-database inspection mode in which dies are compared with corresponding design data for detecting defects.

When any defect has been detected, the process proceeds to the fourth step, where a measure is taken to lessen luminance reduction at the defect. On the other hand, when no defects have been detected, the process skips the fourth step and proceeds to the subsequent step.

4) In the fourth step, a laser beam is applied onto a portion of the surface of the TFT panel, which portion includes a surface exposed through the defect in the pixel electrode (hereinafter may simply referred to as "exposed surface"), to roughen the exposed surface. The expression "laser beam is applied onto a surface of a TFT panel" as used herein means to focus a laser beam on the exposed surface of the TFT panel.

There are no particular limitations on the laser source used for laser irradiation; examples include flash lamp-pumped Nd:YAG laser. When an Nd:YAG laser is employed, the wavelength of laser beam can be selected from 1,064 nm (fundamental), 532 nm (second harmonics), 355 nm (third harmonics), and 266 nm (fourth harmonics) wavelengths.

The wavelength of the laser beam to be applied onto the surface of the TFT panel is preferably 532 nm or less, most preferably 400 nm or less. That is, when employing an Nd:YAG laser, the third or fourth harmonics wavelength may be employed. This is because laser beams with a wavelength of 400 nm or less are more likely to be absorbed by the planarization film that constitutes the TFT panel's surface and therefore are capable of roughening of the panel's surface at high energy efficiency.

The energy (energy density) of the laser beam to be applied may be set to a level enough to effect roughening of the TFT panel's surface. The energy level of the laser beam is determined according to the material and/or thickness of the planarization film that constitutes the TFT panel's surface.

For example, when the TFT panel's surface (planarization film material: positive-type photosensitive resin, thickness: 5 μm) is to be roughened using an Nd:YAG laser, it is preferable to employ the third harmonics wavelength (355 nm) with the energy density set at 0.35 J/cm$^2$ or above.

Roughening of a TFT panel's surface exposed through a defect in a pixel electrode (hereinafter may simply referred to as "roughening of a defect") as described above enables to lessen luminance reduction at the defect. How roughening of a defect is associated with lessening of luminance reduction at the defect will be described in detail later in the section titled "2. Organic EL panel."

In some embodiments, only some selected defects may be roughened rather than roughening all of the defects detected. When roughening is intended for only selected defect(s), the manufacturing method according to an embodiment of the present invention includes, between the third and fourth steps, the steps of: a) determining a criteria from which a defect to be repaired is selected; and b) selecting, from the defects that have been detected, defect(s) that comply with the criteria.

In step a), determination is made of a criteria from which a defect to be repaired is selected. The "criteria from which a defect to be repaired is selected" herein is the distance between a point within a defect, which point is the farthest away from all the points along the edge of the defect, and the edge of the defect (hereinafter may also be referred to as "maximum distance"). The "criteria from which a defect to be repaired is selected" varies depending on the required luminance at the defect.

Figure 2:
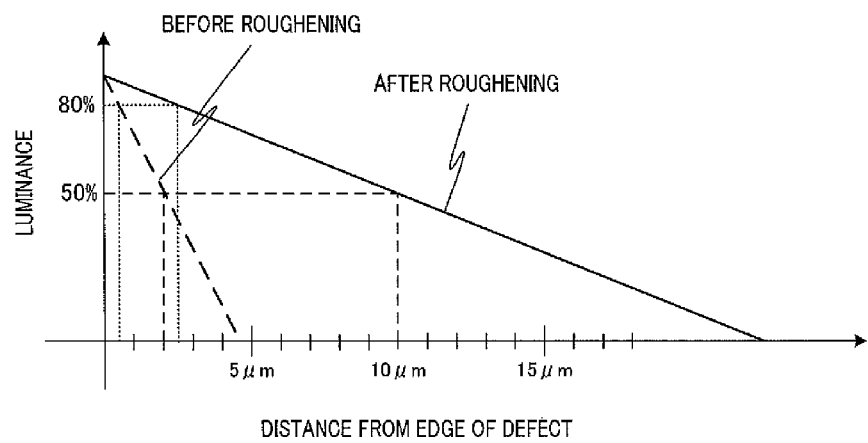
FIG. 2 is a graph of luminance at the center of a defect versus defect size.

FIG. 2 is an exemplary graph of luminance at a given point in a defect versus distance between the point and the edge of the defect (the boundary between the luminescent area and defect). The luminance at a point within a defect is expressed as percent of the luminance at the luminescent area. As seen from FIG. 2, luminance at a given point within a defect decreases as it becomes farther away from the edge of the defect. More specifically, in the case of a roughened defect, the defect exhibits 80% luminance at a point spaced from the edge of the defect by 2.5 μm, and 50% luminance at a point spaced from the edge of the defect by 10 μm. On the other hand, in the case of a non-roughened defect, the defect exhibits 80% luminance at a point spaced from the edge of the defect by 0.5 μm, and 50% luminance at a point spaced from the edge of the defect by 2 μm.

Accordingly, when the required luminance at defects is 50% or more of the luminance at the luminescent area, the "criteria from which a defect to be repaired is selected" may be set to 2 μm to 10 μm. Roughening of defects having a maximum distance of 10 μm or less ensures that the luminance at the defects is 50% or more of the luminance at the luminescent area. Moreover, with regard to defects having a maximum distance of less than 2 μm, the luminance at the defects does not decrease to 50% or less of the luminance at the luminescent area even when they are not roughened. On the other hand, with regard to defects having a maximum distance exceeding 10 μm, the luminance at the defects cannot be increased to a level exceeding 50% of the luminance at the luminescent area even when they are roughened. Thus, when intending to increase the luminance at defects having a maximum distance exceeding 10 μm to a level exceeding 50% of the luminance of the luminescent area, they are preferably repaired in the manner commonly known in the art—by forming new films of electrode material within the defects.

When the required luminance at defects is 80% or more of the luminance at the luminescent area, the "criteria from which a defect to be repaired is selected" may be set to 0.5 μm to 2.5 μm. Roughening of defects having a maximum distance of 2.5 μm or less ensures that the luminance at the defects is 80% or more of the luminance at the luminescent area. Moreover, with regard to defects having a maximum distance of less than 0.5 μm, the luminance at the defects does not decrease to 80% or less of the luminance at the luminescent area even when they are not roughened. On the other hand, with regard to defects having a maximum distance exceeding 2.5 μm, the luminance at the defects cannot be increased to a level exceeding 80% of the luminance at the luminescent area even when they are roughened.

Thus, when intending to increase the luminance at defects having a maximum distance exceeding 2.5 μm to a level exceeding 80% of the luminance of the luminescent area, it is preferable to repair these defects in the manner commonly known in the art—by forming new electrode films in the defects.

As described above, the "criteria from which a defect to be repaired is selected" is determined based on the relationship between the distance from the edge of the defect and luminances of the TFT panel surface before and after roughening. This relationship can be found experimentally by, for example, roughening a surface of a model TFT panel (later described) to a desired level.

5) In the fifth step, an organic functional layer is formed over the pixel electrode and a surface of the TFT panel exposed through the defect in the pixel electrode. The formation of the organic functional layer in an organic EL device may be accomplished either by vapor deposition or coating techniques. In view of achieving a large-screen organic EL display, the organic functional layer is preferably formed by coating techniques. Formation of the organic functional layer by coating techniques may be accomplished by applying an ink containing the material of the organic functional layer and a solvent by inkjet printing, dispensing, nozzle coating, spin coating, intaglio printing, relief printing or other coating technique, followed by drying the applied ink.

6) In the sixth step, a counter electrode is formed over the organic functional layer. The counter electrode is formed by, for example, sputtering.

In this way the present invention enables lessening of luminance reduction at defects without having to form new films of electrode material within the defects, which has been carried out in the art. The present invention thus enables to lessen luminance reductions of organic EL devices at low costs.

2. Organic EL Panel

An organic EL panel according to an embodiment of the present invention is one manufactured by the above-described manufacturing method of the present invention. The organic EL panel is of the top-emission type as well as of the active matrix type, including a TFT panel and organic EL devices disposed over the surface of the TFT panel in matrix arrangement.

The TFT panel includes a substrate, thin-film transistors (hereinafter may simply referred to as "TFTs") disposed over the substrate in matrix arrangement; and a planarization film disposed over the substrate so as to cover the TFTs.

Examples of the material of the substrate include silicon carbide (SiC), alumina ($Al_2O_3$), aluminum nitride (AlN), glass, silicon, and germanium wafer.

Each TFT includes a source electrode; a drain electrode; a channel formed of a semiconductor layer for connecting together the source electrode and drain electrode; a gate electrode for controlling the channel; and a date insulation film for electrically isolating the gate electrode from the source electrode and drain electrode.

There are no particular limitations on the material of the planarization film as long as it is electrically insulating and a pattern of contact holes or like pattern can be formed therein; examples thereof include acrylic and polyimide resins.

Each organic EL device includes a pixel electrode disposed over the surface of the TFT panel; an organic functional layer disposed over the pixel electrode; and a counter electrode disposed over the organic functional layer. The organic EL devices may further include a bank for defining the organic functional layer.

The pixel electrode is an electrically conductive member. The pixel electrode generally serves as an anode, but may serve as a cathode. The pixel electrode preferably has light reflectivity. Examples of materials of the pixel electrode include APC alloys (silver-palladium-copper alloys), ARA alloys (silver-ruthenium-gold alloys), MoCr alloys (molybdenum/chrome alloys), and NiCr alloys (nickel/chrome alloys). The pixel electrode may be connected to the drain electrode or source electrode of a TFT through a contact hole provided in the planarization film on the TFT panel.

The organic functional layer includes an organic luminescent layer containing organic luminescent material. The organic luminescent material contained in the organic luminescent layer is preferably polymeric organic luminescent material so that the layer can be formed by coating methods. Examples of the polymeric organic luminescent material include polyphenylenevinylene and its derivatives, polyacetylene and its derivatives, polyphenylene and its derivatives, poly para phenylene ethylene and its derivatives, poly (3-hexylthiophene) and its derivatives, and polyfluorene and its derivatives.

The organic luminescent layer emits red, green or blue light depending on the position of the organic EL device. The organic functional layer may further include a hole injection layer, a hole transport layer, an electron transport layer, and other layers.

The bank is an insulating partition wall for defining the organic functional layer. The bank may be patterned by exposing and developing a resist material, which is a photosensitive material.

The counter electrode is an electrically conductive member disposed over the organic functional layer. The counter electrode generally serves as a cathode, but may also serve as an anode. The counter electrode preferably has a light transmittance. Examples of materials of the counter electrode include ITO and IZO. The counter electrode is about 100 nm in thickness.

A feature of the present invention is that the surface of the TFT panel exposed through a defect in a pixel electrode is roughened. There are no particular limitations on the degree to which the exposed surface is roughened, as long as the TFT panel exhibits reduced light transmittance (or luminance) at the exposed surface due to light diffusion. The exposed surface roughened preferably has an arithmetic average roughness of 0.25 µm or more which is preferably smaller than the thickness of the planarization film. Measurement of arithmetic average roughness of the roughened exposed surface can be accomplished using any of the general surface roughness analyzers.

In the present invention the surface of the TFT panel exposed through a defect in a pixel electrode is roughened as described above, whereby luminance reduction at the defect, a non-luminescent area, is lessened. How roughening of a defect is associated with lessening of luminance reduction at the defect will now be described with reference to the accompanying drawings.

Figure 3:
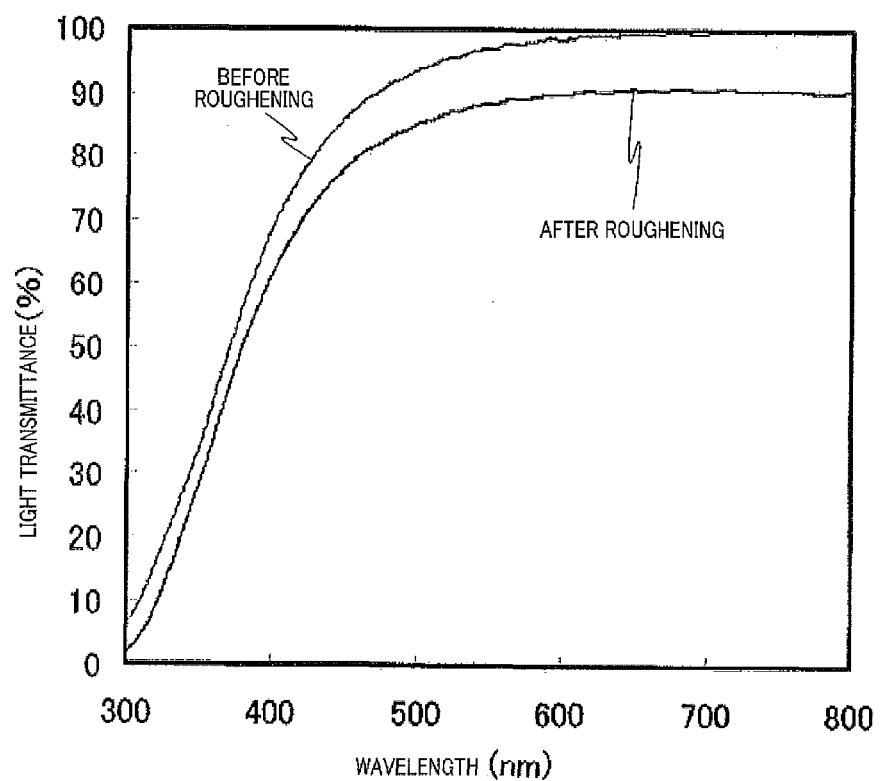
FIG. 3 is a graph showing light transmittance of a TFT panel with and without a roughened surface.

FIG. 3 shows light transmittances of a TFT panel model before and after roughening, where the TFT panel model includes a 0.7 mm-thick glass substrate and a 5 µm-thick resin film disposed on the glass substrate. The wavelength of a laser beam used to roughen the resin surface of the TFT panel model is 355 nm with energy density set at 0.35 J/cm². Light beams of different wavelengths are then applied onto the resin surface of the TFT panel, measuring intensities of the light beams passed through the glass substrate to measure light transmittance of the manufactured TFT panel. As seen from FIG. 3, for example, a TFT panel having a roughened surface successfully exhibited approximately 10% reduced transmittance to light having a wavelength of 500 nm to 800 nm. The fact that a TFT panel that has a roughened resin surface exhibited reduced light transmittance suggests that the TFT panel exhibits increased light reflectivity correspondingly.

As described above, a TFT panel having a roughened surface exhibits reduced light transmittance. How reduced light transmittance of a TFT panel is associated with lessening of luminance reduction at a defect will now be described.

Figure 4:
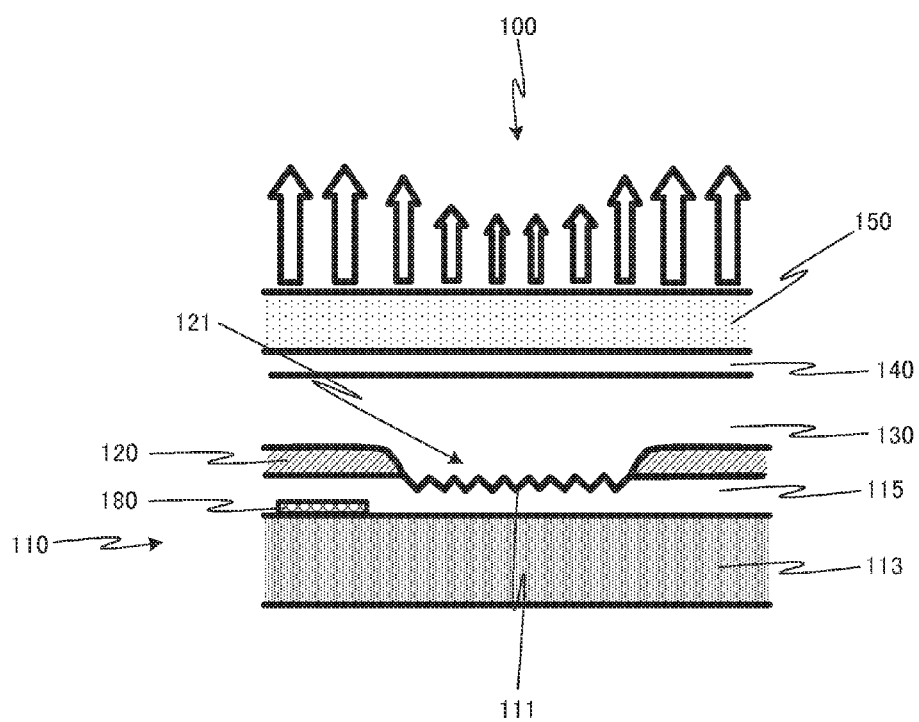
FIG. 4 is a cross-sectional view of an organic EL device according to an embodiment of the present invention.

FIG. 4 illustrates an organic EL device having defect 121 in pixel electrode 120. Organic EL device 100 includes TFT panel 100, TFT 180, pixel electrode 120, organic functional layer 130, counter electrode 140, and sealing layer 150. Organic EL device 100 has defect 121 in which a portion of pixel electrode 120 is lost. A surface of TFT panel 110 is exposed through defect 121. Surface 111 of TFT panel 110 exposed through defect 121 is roughened.

Since defect 121 is a non-luminescent area (defect) as described above, organic functional layer 130 does not emit light at a position corresponding to defect 121. Nevertheless, light beams emitting from other areas of organic functional layer 130 around defect 121 also travel into defect 121. Thus, light can also be out-coupled from defect 121, a non-luminescent area. Moreover, since TFT panel 110 exhibits reduced light transmittance at roughened surface 111 as described above, light beams travelled into defect 121, where roughened surface 111 is present, are less likely to pass through TFT panel 110. Thus, most of the light beams travelled into defect 121 do not pass through TFT panel 110 and can be out-coupled from counter electrode 140 side. In this way the present invention makes it possible to out-couple light from defect 121 even when defect 121 forms a non-luminescent area, lessening luminance reduction at defect 121.

Figure 5:
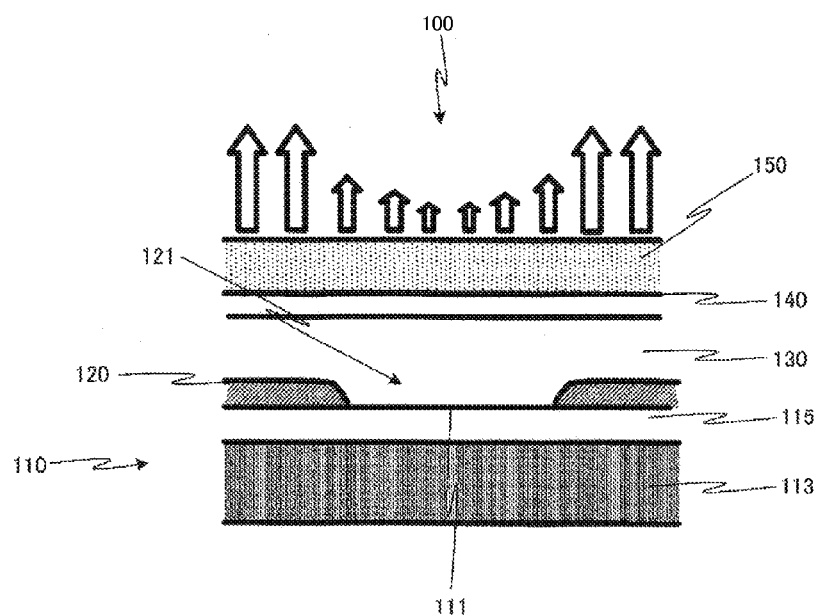
FIG. 5 is a cross-sectional view of an organic EL device.

On the other hand, when surface 111 of the TFT panel exposed through defect 121 is not roughened as illustrated in FIG. 5, the TFT panel exhibits high light transmittance. Thus, light beams travelled into defect 121 from surrounding areas of organic functional layer 130 are more likely to pass through TFT panel 110 to the outside. Thus, when surface 111 of the TFT panel exposed through defect 121 is not roughened, the amount of light which can be out-coupled from counter electrode 140 side is reduced by an amount corresponding to the amount of light passing through the TFT panel to the outside, resulting in reduced luminance.

A method of manufacturing an organic EL display according to an embodiment of the present invention will now be described with reference to the accompanying drawings. The following description is focused on the manufacturing steps subsequent to the third step in which detection of defects is carried out.

Figure 6:
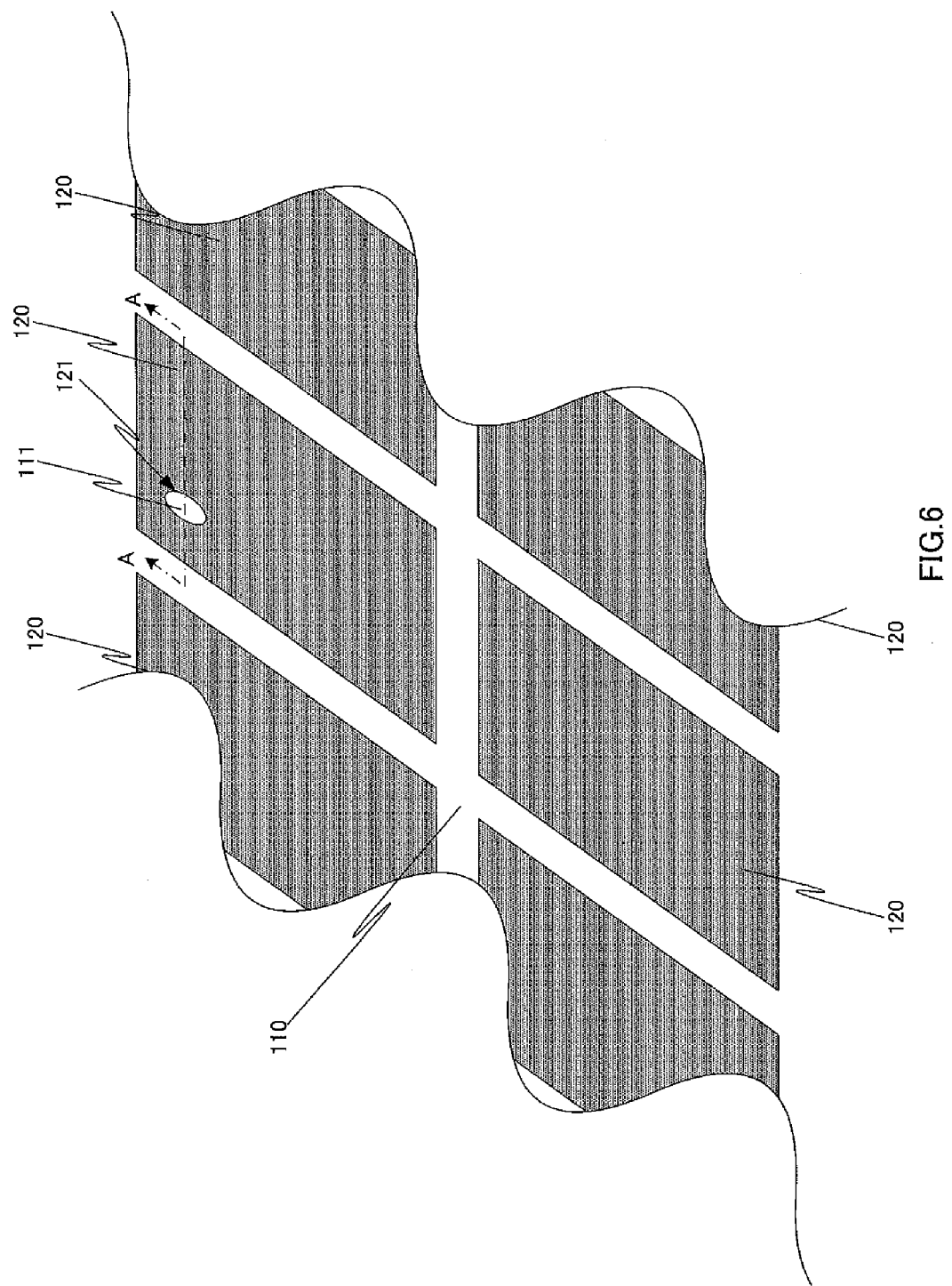
FIG. 6 is a perspective view of a pixel electrode having a defect.

FIG. 6 is a perspective view of a pixel electrode having a defect detected in the third step (step of detecting any defect in the pixel electrodes). FIG. 7A is a cross-sectional view of the defective pixel electrode illustrated in FIG. 6, which is cut along dashed line AA.

As illustrated in FIG. 6 and FIG. 7A, surface 111 of TFT panel 110 is exposed through a defect in the pixel electrode. The TFT panel includes substrate 113 having thereon TFTs 180, and planarization film 115 disposed over the substrate so as to cover the TFTs 180.

FIG. 7B illustrates the fourth step (laser irradiation step) according to the present invention. As illustrated in FIG. 7B, in the fourth step, laser beam 170 is applied onto surface 111 exposed through defect 121.

By irradiation with laser beam 170, the surface of the TFT panel exposed through defect 121 is roughened (FIG. 7C).

FIG. 7D illustrates the fifth step according to the present invention. As illustrated in FIG. 7D, in the fifth step, organic functional layer 130 is formed over pixel electrode 120 and surface 111 by application of a material solution of organic functional layer 130.

FIG. 7E illustrates the sixth step according to the present invention. As illustrated in FIG. 7E, in the sixth step, counter electrode 140 is formed over organic functional layer 130 by, for example, sputtering.

This application is entitled to and claims the benefit of the priority of Japanese Patent Application No. 2011-045014 filed on Mar. 2, 2011, the disclosure of which is incorporated herein by reference in its entirety.

INDUSTRIAL APPLICABILITY

The manufacturing method according to an embodiment of the present invention enables lessening of luminance reduction at defects in pixel electrodes without needing having to repair the defects, whereby reduced defects rates and improved quality are realized for organic EL panels.

REFERENCE SIGNS LIST

100 Organic EL device
110 TFT panel
111 Surface of TFT panel exposed through defect
113 Substrate
115 Planarization Film
120 Pixel electrode
121 Defect
130 Organic functional layer
140 Counter electrode
150 Sealing film
170 Laser beam

The invention claimed is:

1. A method of manufacturing an organic EL panel, comprising:
    providing a TFT panel;
    patterning pixel electrodes on a surface of the TFT panel;
    detecting, in the pixel electrodes, defects in which the surface of the TFT panel is exposed;
    roughening a portion of the surface of the TFT panel by applying a laser beam onto the portion, the portion including a surface exposed through a defect of the defects in a pixel electrode of the pixel electrodes;
    forming an organic functional layer over the pixel electrodes and the roughened portion of the surface of the TFT panel exposed through the defect in the pixel electrode; and
    forming a counter electrode over the organic functional layer.

2. The method according to claim 1, wherein the laser beam has a wavelength of 400 nm or less.

3. The method according to claim 1, further comprising:
    determining a criteria from which one or more of the defects to be repaired is selected; and
    selecting, from the defects detected, one or more of the defects that comply with the criteria,
    wherein the laser beam is applied onto the surface of the TFT panel, the surface exposed through the one or more of the defects selected.

4. An organic EL panel comprising:
    a TFT panel; and
    organic EL devices disposed over a surface of the TFT panel in a matrix arrangement, each of the organic EL devices including a pixel electrode disposed over the surface of the TFT panel, an organic functional layer disposed over the pixel electrode, and a counter electrode disposed over the organic functional layer,
    wherein at least one of the organic EL devices has a defect in which the surface of the TFT panel is exposed, the surface exposed through the defect is roughened, and
the organic functional layer is disposed on a roughened
  portion of the surface of the TFT panel.

5. The organic EL panel according to claim 4, wherein the roughened surface of the TFT panel exposed through the defect has an arithmetic average roughness of 0.25 μm or more.

6. The organic EL panel according to claim 4, wherein the TFT panel includes a substrate, TFTs disposed over the substrate in a matrix arrangement, and a planarization film disposed over the substrate so as to cover the TFTs, the planarization film constituting the surface of the TFT panel.

7. The organic EL panel according to claim 6, wherein the planarization film is formed of a cured product of a photosensitive resin.

* * * * *